(12) United States Patent
Lu et al.

(10) Patent No.: US 9,431,404 B2
(45) Date of Patent: *Aug. 30, 2016

(54) TECHNIQUES PROVIDING HIGH-K DIELECTRIC METAL GATE CMOS

(71) Applicant: Taiwan Semiconductor Manufacturing Company, Ltd., Hsin-Chu (TW)

(72) Inventors: Wei-Yuan Lu, Taipei (TW); Kuan-Chung Chen, Taipei (TW); Chun-Fai Cheng, Tin Shui Wai (HK)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/808,460

(22) Filed: Jul. 24, 2015

(65) Prior Publication Data
US 2015/0333076 A1 Nov. 19, 2015

Related U.S. Application Data

(60) Continuation of application No. 14/049,829, filed on Oct. 9, 2013, now Pat. No. 9,099,346, which is a division of application No. 13/191,297, filed on Jul. 26, 2011, now Pat. No. 8,580,641.

(51) Int. Cl.
| | |
|---|---|
| *H01L 27/11* | (2006.01) |
| *H01L 27/092* | (2006.01) |
| *H01L 29/06* | (2006.01) |
| *H01L 29/49* | (2006.01) |
| *H01L 29/51* | (2006.01) |

(Continued)

(52) U.S. Cl.
CPC ........ *H01L 27/11* (2013.01); *H01L 21/28176* (2013.01); *H01L 21/823842* (2013.01); *H01L 21/823857* (2013.01); *H01L 27/0922* (2013.01); *H01L 27/1104* (2013.01); *H01L 29/0649* (2013.01); *H01L 29/4966* (2013.01); *H01L 29/511* (2013.01); *H01L 29/517* (2013.01); *H01L 29/66545* (2013.01); *H01L 29/7827* (2013.01)

(58) Field of Classification Search
None
See application file for complete search history.

(56) References Cited

U.S. PATENT DOCUMENTS

| | | |
|---|---|---|
| 7,126,199 B2 | 10/2006 | Doczy et al. |
| 7,153,784 B2 | 12/2006 | Brask et al. |

(Continued)

OTHER PUBLICATIONS

P. Packan et al., "High Performance 32nm Logic Technology Featuring 2$^{nd}$ Generation High-k + Metal Gate Transistors", IEEE, 2009, pp. 8.4.1-28.4.4.

*Primary Examiner* — Khaja Ahmad
(74) *Attorney, Agent, or Firm* — Haynes and Boone, LLP

(57) ABSTRACT

A semiconductor device includes a dielectric layer on a substrate, a P-type transistor having a first gate stack embedded in the dielectric layer, and an N-type transistor having a second gate stack embedded in the dielectric layer. The first gate stack includes a first metal gate electrode, a first gate dielectric layer underlying the first metal gate electrode, and a first cap layer between the first gate dielectric layer and the first metal gate electrode. The second gate stack includes a second metal gate electrode, a second gate dielectric layer underlying the second metal gate electrode, and a second cap layer between the second gate dielectric layer and the second metal gate electrode. The first and second gate stacks are adjacent, and the first and second metal gate electrodes are separated from each other by the first and second cap layers.

20 Claims, 12 Drawing Sheets

(51) Int. Cl.
*H01L 21/8238* (2006.01)
*H01L 21/28* (2006.01)
*H01L 29/66* (2006.01)
*H01L 29/78* (2006.01)

(56) References Cited

U.S. PATENT DOCUMENTS

| | | | |
|---|---|---|---|
| 7,714,393 | B2 | 5/2010 | Tai et al. |
| 7,947,588 | B2 | 5/2011 | Yu et al. |
| 8,513,740 | B2 | 8/2013 | Park et al. |
| 2006/0065939 | A1 | 3/2006 | Doczy et al. |
| 2007/0040227 | A1 | 2/2007 | Datta et al. |
| 2008/0087966 | A1 | 4/2008 | Tai et al. |
| 2008/0242012 | A1 | 10/2008 | Pae et al. |
| 2009/0042405 | A1* | 2/2009 | Doczy ............ H01L 21/823842 438/785 |
| 2009/0206415 | A1* | 8/2009 | Chiang ........... H01L 21/823842 257/369 |
| 2010/0041223 | A1* | 2/2010 | Chen ................. H01L 21/28088 438/591 |
| 2010/0052066 | A1 | 3/2010 | Yu et al. |
| 2010/0052067 | A1* | 3/2010 | Hsu ................. H01L 21/823842 257/369 |
| 2010/0081262 | A1* | 4/2010 | Lim ................. H01L 21/823842 438/479 |
| 2011/0121399 | A1 | 5/2011 | Park et al. |
| 2012/0292710 | A1 | 11/2012 | Cheng et al. |
| 2012/0326238 | A1* | 12/2012 | Chien ............. H01L 21/823842 257/369 |

* cited by examiner

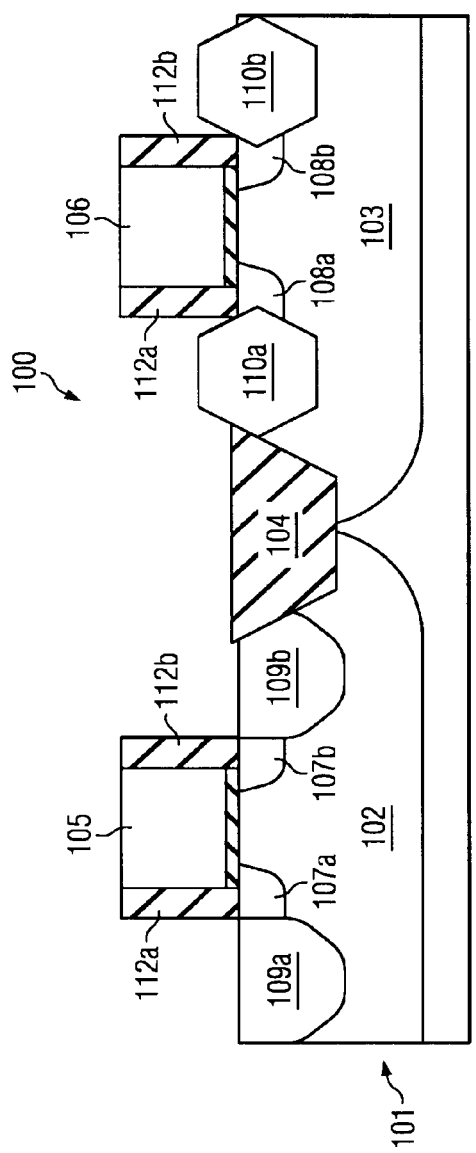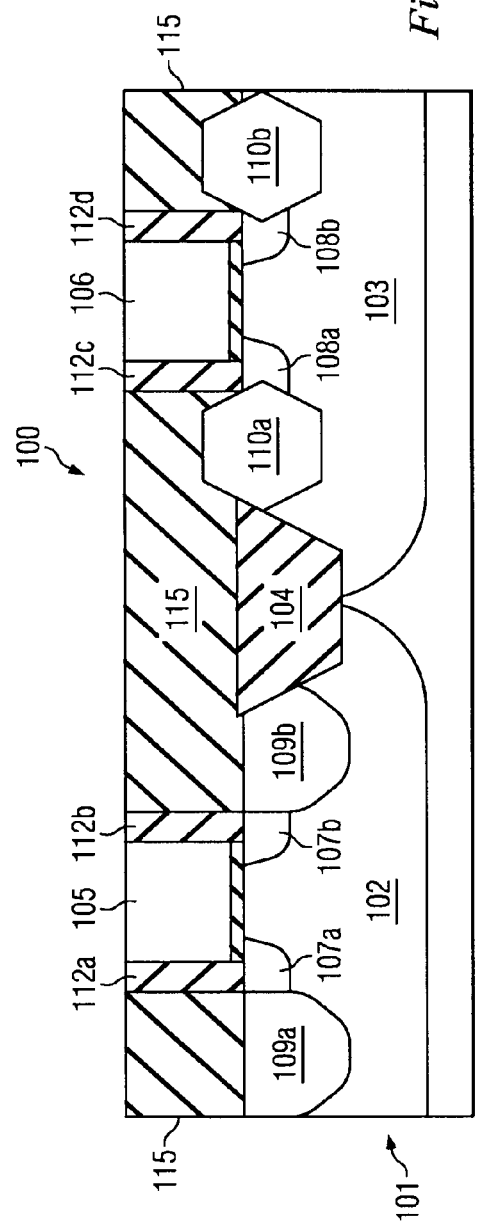

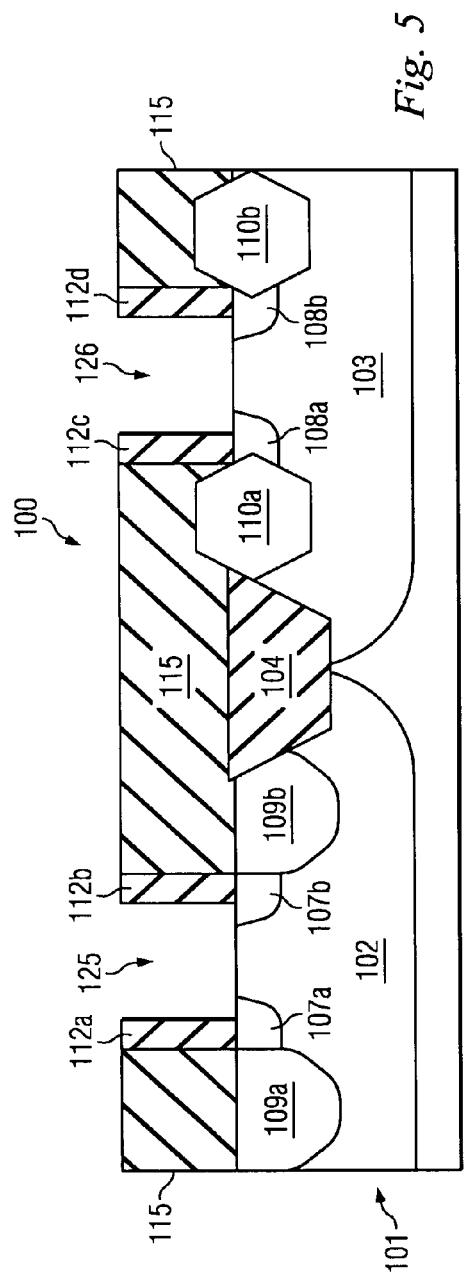
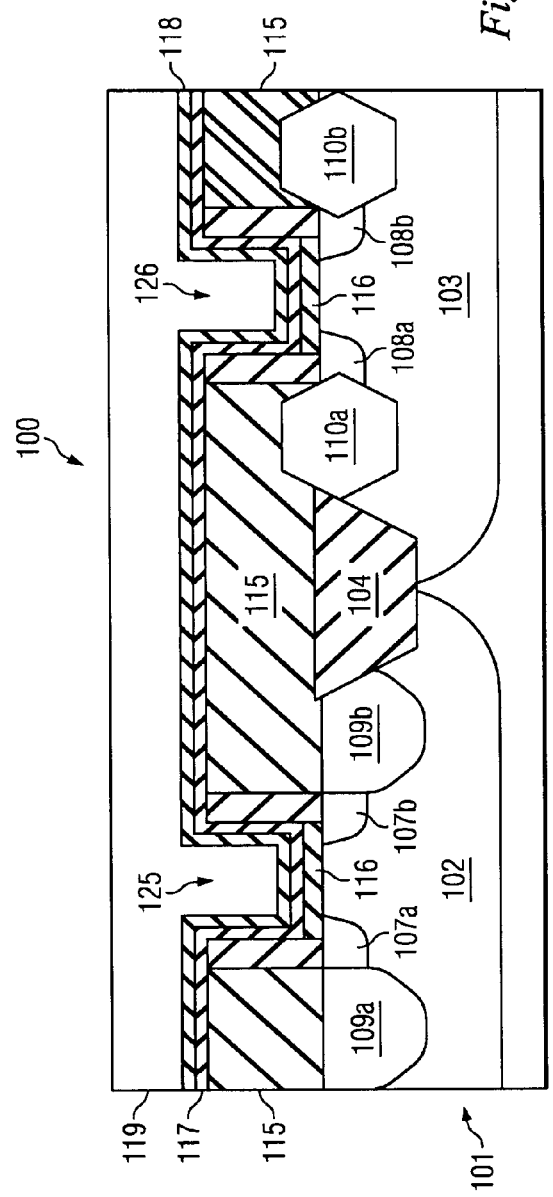

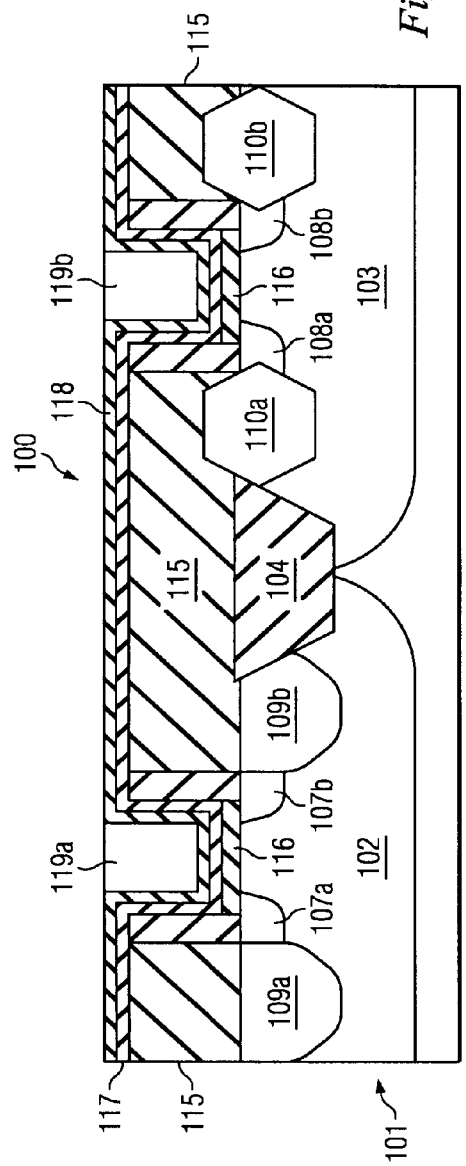
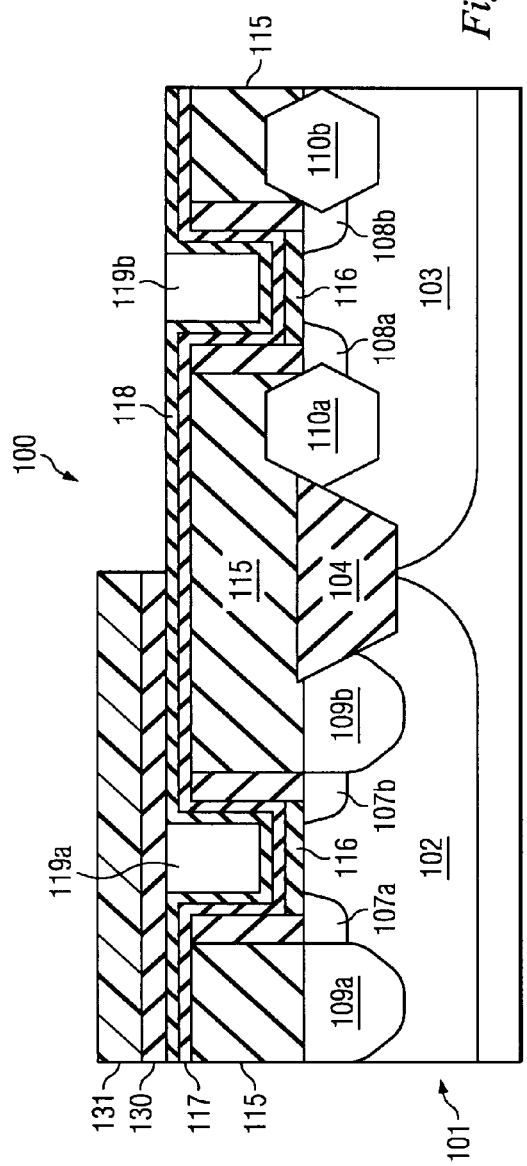

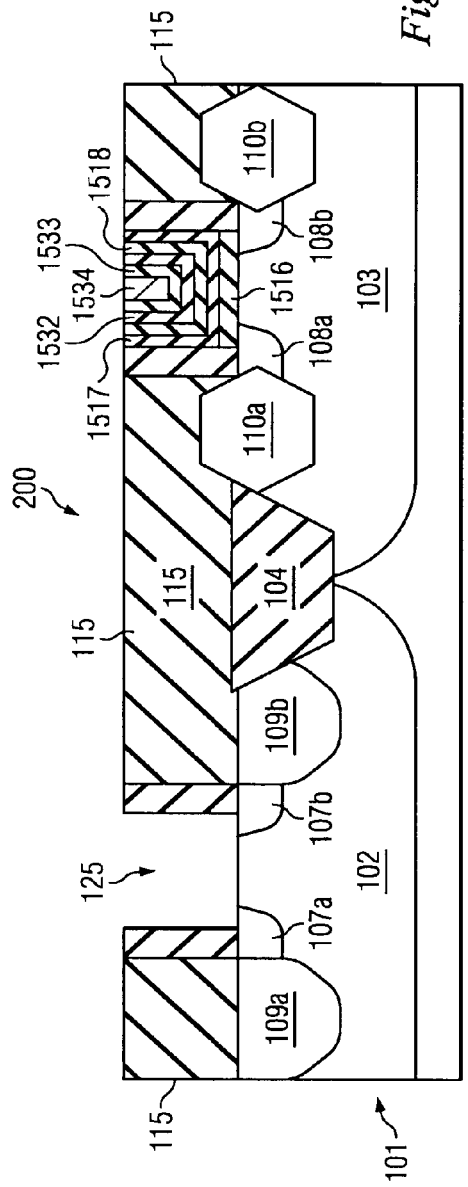
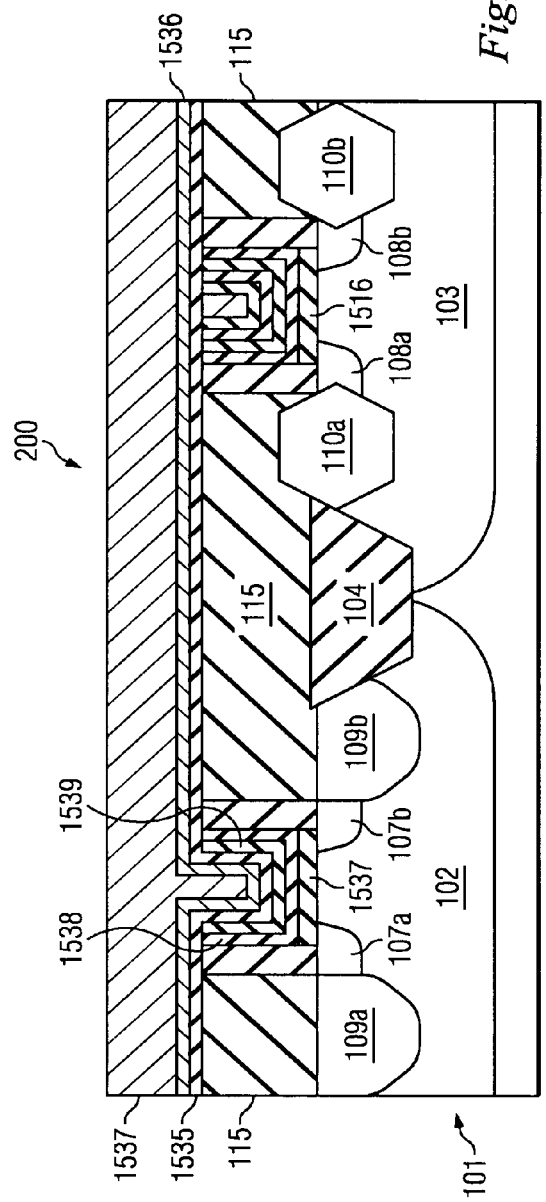

US 9,431,404 B2

TECHNIQUES PROVIDING HIGH-K DIELECTRIC METAL GATE CMOS

PRIORITY INFORMATION

This application is a continuation of U.S. application Ser. No. 14/049,829 filed Oct. 9, 2013, which is a divisional of U.S. application Ser. No. 13/191,297, which was filed on Jul. 26, 2011, now patented, the entire disclosure of which is incorporated herein by reference.

BACKGROUND

In one example conventional SRAM device, a pull up and a pull down device are formed adjacent each other and in electrical contact to create an inverter device. The pull down device may be an N-type transistor, and the pull up device may be a P-type transistor, where gates of the two transistors are electrically coupled. Further, the SRAM device has multiple inverters laid out in multiple parallel trenches.

In one conventional method, there is PFET metal deposited in N/PFET poly trench. After metal gate photo patterning, the NFET trench is exposed and PFET metal is removed. However, such conventional techniques may leave PFET metal residue, especially in narrow trenches. Metal mixing by NFET and PFET work function metals may make it more difficult to control work function and voltage threshold in the NFET device. Furthermore, such conventional method may fabricate a NFET metal gate using two layers of metals (a PFET work function metal underneath an NFET work function metal). However, the double metal layer makes the opening in trench quite narrow, thereby decreasing the process window for the metal fill and reducing the chance to scale a barrier metal. Accordingly, while some processes may be satisfactory for some applications, improvement would be desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1-13 are cross-sections of an exemplary device, illustrating an exemplary process for manufacturing metal gates in accordance with various aspects of the present disclosure.

FIGS. 15-21 are cross-sections of an exemplary device, illustrating an exemplary process for manufacturing metal gates in accordance with various aspects of the present disclosure.

SUMMARY

Figure 1:
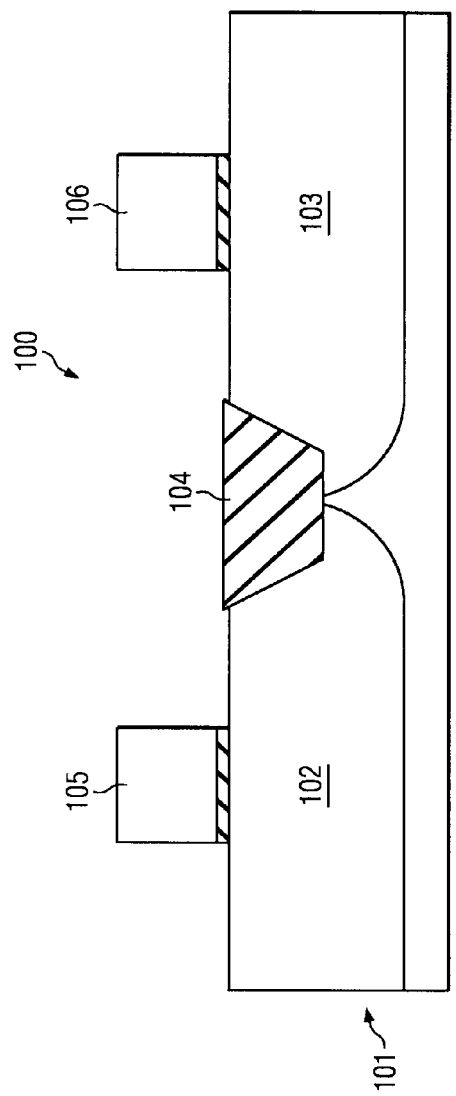

One of the broader forms of the present disclosure involves a method for manufacturing a semiconductor device includes forming a first dummy gate on a substrate, performing a doping process to the substrate, thereby forming a source and a drain at sides of the first dummy gate, performing a first high temperature annealing to activate the source and drain, forming an inter-layer dielectric (ILD) material on the substrate, removing the first dummy gate to create an ILD trench, forming a first high-k dielectric layer within the ILD trench, forming a first dummy cap portion within the ILD trench over the first high-k dielectric layer, performing a second high-temperature annealing to reduce defects in the first high-k dielectric layer, and thereafter, replacing the first dummy cap portion with a first metal gate electrode.

Another one of the broader forms of the present disclosure involves a semiconductor device includes a dielectric layer on a substrate, a P-type transistor having a first gate stack embedded in the dielectric layer, and an N-type transistor having a second gate stack embedded in the dielectric layer. The first gate stack includes a first metal gate electrode and a first high-k dielectric layer underlying the first metal gate electrode and on sidewalls of the first metal gate electrode, and the second gate stack includes a second metal gate electrode and a second high-k dielectric layer underlying the second metal gate electrode and on sidewalls of the second metal gate electrode. The first and second gate stacks are adjacent, and the first and second metal gate electrodes are electrically insulated from each other by the first and second high-k dielectric layers.

Still another one of the broader forms of the present disclosure involves a Random Access Memory (RAM) integrated circuit includes a P-type device and an N-type device formed on a substrate, the P-type device including a first metal gate structure, and the N-type device including a second metal gate structure formed in a same Inter Layer Dielectric (ILD) trench with the first metal gate structure. A dimension of the trench includes the first and second metal gate structures separated by first and second high-k dielectric layers and first and second cap layers.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact Various embodiments include methods for manufacturing a semiconductor device. In one example, a method provides for a "double U" (DU) process that forms two gate structures adjacent each other in an Interlayer Dielectric (ILD) trench. A cross-section of the ILD trench along a greatest dimension of the trench reveals the two gate structures.

Further in this example, the two gate structures may include a PMOS gate structure and an NMOS gate structure, which together form an inverter at least in part by virtue of their electrical coupling. When the gate structures are formed in the trench, two different high-k dielectric layers and cap layers are formed and patterned—one for each of the gate structures.

In a lengthwise cross-section of the trench, the high-k dielectric layers and cap layers appear to surround their respective metal gate portions on three sides where only the tops of the metal gate portions are exposed. Thus, the two metal gate portions are separated from each other by the two high-k dielectric layers and the two cap layers. Such a feature may reduce or eliminate work function metal intermixing at the NMOS/PMOS boundary. One or more upper-level metal structures may be made to electrically connect the metal gate structures.

The example above discusses two devices within a larger integrate circuit. For instance, the combined device may be one of many such devices in a RAM circuit, such as an SRAM circuit.

Another example embodiment includes a method for manufacturing a semiconductor device. This present example provides a high-k last DU process to make MOS devices the same as, or similar to, that described immediately above.

In a broader form of the embodiment, the method includes forming dummy gates on a substrate. Respective source and drain areas are then formed by doping and annealing.

The dummy gates are removed to form ILD trenches. One particular embodiment removes the dummy gates for both P and N devices, while another embodiment removes the dummy gates for the P device first. This example continues by discussing the embodiment in which both P and N dummy gates are removed.

Continuing with the example, a high-k dielectric layer is then deposited in the trenches and annealed. Then, a dummy cap is formed in the trenches covering the high-k dielectric layer. The layer forming the dummy cap is etched and patterned to expose trenches for P-type devices. Metal gates are then formed in the P-type devices.

Next, the dummy cap is removed for the N-type devices. Metal gates are formed in the N-type devices. The work function metal of the gates is not exposed to high temperatures because the high-temperature annealing for the high-k dielectric layer is performed before the metal gates are formed. Furthermore, metal gates of the P-type devices and the N-type devices are formed of separate layers in separate processes, allowing for greater control over their respective work functions.

As mentioned above, in a similar process, the dummy gates are removed for the P-type devices first. A high-k dielectric layer is then formed that covers the dummy gates at the N-type devices and creates a layer within the trenches for the P-type devices. A dummy cap layer is formed and patterned to cover the high-k dielectric layer in the P-type devices. The high-k dielectric layer is then annealed.

The dummy caps are removed, and metal gates are then formed in the P-type devices, where a cap layer and the high-k dielectric layer surround the metal gates in the P-type devices.

After the metal gates are formed for the P-type devices, the dummy gates are removed for the N-type devices. A second high-k dielectric layer is then deposited so as to provide high-k material in the trenches for the N-type devices. In this example, the second high-k dielectric layer is not subjected to high-temperature annealing to avoid damaging the PMOS gates. Low-temperature annealing may optionally be performed later.

Metal gates are then formed in the N-type devices. A cap layer and the high-k dielectric material surround the metal gates in the N-type devices. It is noted in this example, that the adjacent metal gates in each trench are separated by the cap layer, as well as by high-k dielectric material. This arrangement provides extra protection against work function metal intermixing. Additionally, the metal gate structures are formed by separate layers, thereby allowing for greater control in tuning their respective work functions.

The example methods described above include DU methods that form the P-type metal and N-type metal in separate processes. In contrast to some conventional processes, some example DU embodiments do not form a double layer of N-type metal and P-type metal in NMOS gates. This may provide a larger process window for the metal fill and also allow for more scaling adjustment of barrier metal in the NMOS gate.

The following figures describe various embodiments in more detail. However, the scope of embodiments is not limited to the specific materials shown or to any particular trench or gate size. Additionally, the figures show two gates at a time, and it is understood that real-life processes will typically be performed on wafers that include many millions or billions of such structures. One example application of the processes and structures described herein includes SRAM devices, though the scope of embodiments covers any kind of MOS integrated circuit.

FIG. 1 is an illustration of a portion of an exemplary semiconductor device 100 adapted according to one embodiment. FIGS. 1-13 show semiconductor device 100 in cross-section and in various stages of manufacture, and cumulatively, FIGS. 1-13 show a first process embodiment.

Semiconductor device 100 includes substrate 101 with P well 102 and N well 103, as well as Shallow Trench Isolation (STI) structure 104. Substrate 101 is shown as a silicon substrate, though the scope of embodiments includes other substrates of other materials, such as GaAs and the like.

Dummy polysilicon gates 105 and 106 are formed on substrate 101 by depositing a layer of polysilicon by, e.g., Chemical Vapor Deposition (CVD) or Physical Vapor Deposition (PVD), and then patterning the polysilicon material using dry and/or wet etching. Dummy gates 105, 106 are shown in their height and width dimensions, and it is understood that dummy gates 105, 106 have a depth dimension extending into the page. As can be inferred from the orthogonal cross-section of FIG. 14, the depth dimension is larger than either of the height or width dimensions.

Figure 2:
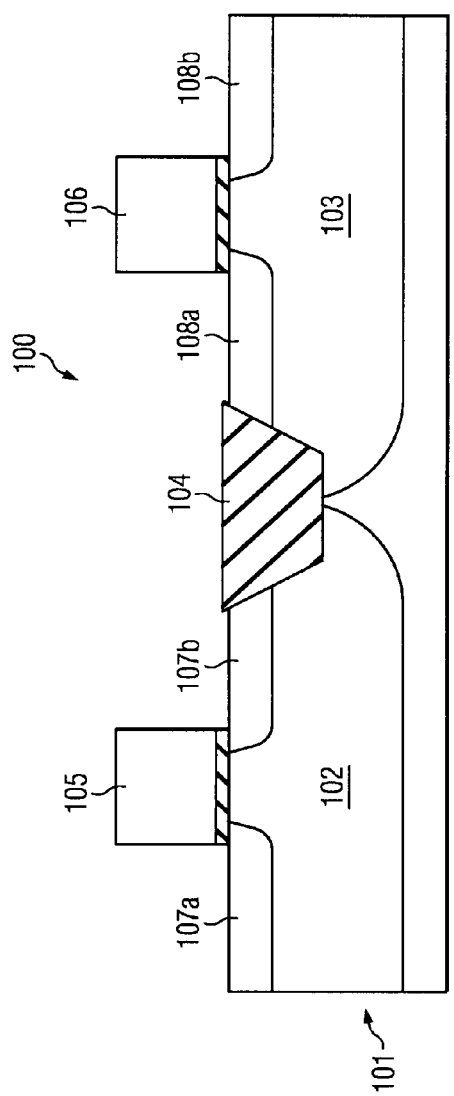

Moving to FIG. 2, an implantation process is performed to create source and drain regions 107, 108 around dummy gates 105, 106. The process of FIG. 2 includes ion implantation that creates Light Doped Drain (LDD) regions 107, 108. LDD regions 107 are doped with N-type ions, whereas LDD regions 108 are doped with P-type ions. Accordingly, the left side of the semiconductor portion in FIG. 2 will host an NMOS device (an NFET device), and the right side of the portion shown in FIG. 2 will host a PMOS device (a PFET device).

In FIG. 3, sidewalls 112 are formed at dummy gates 105, 106. Sidewalls in this example are formed of SiN, though other embodiments may use any suitable material. SiN may be deposited over the structure and then patterned to create sidewalls 112. For instance, the SiN may be deposited by CVD and dry etched to create sidewalls 112.

After sidewalls 112 are formed, ion implantation are used to create N-type source and drain (NSD) regions 109. NSD regions are doped with N-type ions. Epitaxial growth processes are used to create region 110. For instance, an etch process may be used to recess the substrate 101, and epitaxial growth processes may be used to grow region 110. Regions 110 are in the P device and include SiGe. However, other suitable materials may be used by different embodiments. Furthermore, in some embodiments source and drain region 110 may include heavily doped source and drain and may also include salicide for reduced contact resistance. Whereas in some embodiments, N-type source and drain regions 109 may use silicon epitaxial growth layer with lightly doped phosphorous, heavily doped phosphorous, lightly doped carbon, or both.

After formation of regions 109, 110, a thermal annealing step is performed to activate the doped impurities. This example includes a high-temperature thermal annealing step that may apply temperatures anywhere in the range of 900 C-1100 C, though other embodiments may use temperatures within a different range. In this example, high-temperature annealing includes thermal processes with temperatures above 600 C. Further, this embodiment may include a "spike" annealing process that has a very short time duration.

Moving to FIG. 4, after the implantation and annealing is accomplished, the method continues by forming ILD 115 on top of the structure. In this example, ILD 115 is silicon oxide, though other suitable dielectric materials may be used in other embodiments. ILD 115 is deposited and then planarized, such as by CVD and Chemical Mechanical Planarization (CMP), though any suitable processes can be used. The planarization process removes portions of ILD 115 so that the top of ILD 115 is coplanar with the tops of dummy gates 105, 106.

In subsequent processing steps, dummy gates 105, 106 are removed to create trenches. The method illustrated by FIGS. 1-13 replaces dummy gates 105, 106 with metal gate structures, as described in more detail below.

FIG. 5 shows removal of dummy gates 105, 106. Dummy gates 105, 106 may be removed by dry etching, wet etching, or a combination of dry and wet etching to form trenches 125, 126. In some instances, dummy gates 105, 106 are formed on top of a SiO2 interfacial layer. In such instances, the interfacial layer may also be removed using, e.g., HF wet etching or other suitable process after dummy gates 105, 106 are removed to expose the substrate surface.

The method shown by FIGS. 1-13 includes three cycles (broadly described in FIG. 23), where the first cycle includes formation and removal of dummy gates 105, 106. FIG. 6 begins the second cycle, which includes formation of a high-k dielectric layer 117 and a dummy cap 119.

Continuing with FIG. 6, interfacial layer 116 is formed in trenches 125, 126 using, e.g., thermal oxidation ALD and then patterned so that it only remains in the trenches 125, 126. An example material for use in interfacial layer 116 include SiO2, though any suitable material may be used in other embodiments.

After interfacial layer 116 is formed and patterned, high-k dielectric layer 117 is formed on the device 100. Any of a variety of high-k materials may be used in dielectric layer 117, and in this example, HfO2 or HfZrO2 may be used. Example processes for formation of high-k dielectric layer 117 include Atomic Layer Deposition (ALD), though any suitable process may be used in other embodiments.

Following deposition of high-k dielectric layer 117, titanium nitride (TiN) layer 118 is formed as an etch stop layer to protect underlying layers in subsequent steps that remove dummy cap 119 and/or pattern other layers. TiN layer 118 also acts as a cap layer to interface high-k dielectric layer 117 with work function metal (not shown) formed in the gates in subsequent steps. TiN layer 118 may be formed by any suitable process, such as by ALD or PVD, but in this example is formed by ALD to provide characteristics suitable for use as an etch stop layer.

Following deposition of TiN layer 118, the method continues with formation of dummy cap 119. Dummy cap 119 fills in trenches 125, 126 during subsequent processes, as described in more detail below. Dummy cap 119 provides a similar utility as that provided by dummy gates 105, 106 (FIGS. 1-4). That is, dummy cap 119 fills in trenches 125, 126 and protects underlying material from patterning processes in subsequent steps. It is usually more desirable to subject a dummy feature, such as dummy cap 119, to patterning and annealing processes than it is to subject a metal gate structure to those same processes. Thus, in one aspect, dummy cap 119 also helps to prevent thermal damage or edge damage to metal gate structures.

Dummy cap 119 is formed of polysilicon in this example, though other embodiments may use other materials. Polysilicon may be formed, for example, using a CVD process. It is noted that dummy cap 119 fills trenches 125, 126 for places that will host PMOS gates as well as for places that will host NMOS gates.

Figure 14:
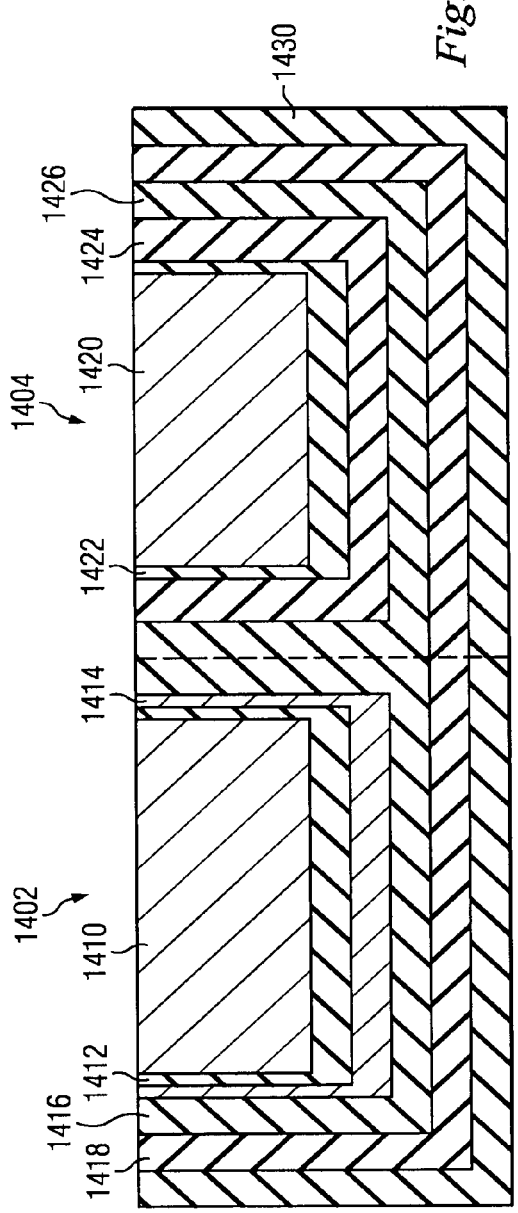
FIG. 14 is a cross-section perpendicular to the cross-section of FIGS. 1-13.

Of interest in FIG. 6 is that high-k dielectric layer 117 is deposited for both PMOS gates and NMOS gates and is deposited for the entire depth dimension of trenches 125, 126. For each of trenches 125, 126, two electrically coupled devices will be formed to create. Thus, trench 125 is shown with an unfinished NFET device, and directly behind the unfinished NFET device in trench 125 is an unfinished PFET device (not shown) similar to the unfinished PFET device in trench 126. Similarly, directly behind the unfinished PFET device in trench 126 is an unfinished NFET device (not shown) similar to the unfinished NFET device shown in trench 125. FIG. 14 shows a cross-section along a trench, after gates electrodes are finished.

At FIG. 7, the portion of dummy cap layer 119 above TiN layer 118 is removed. In this example, a dry etch or CMP process is used, and the polysilicon removal stops at TiN layer 118. The polysilicon removal step is followed by another high-temperature annealing step, which may be very short in duration and apply temperatures in the range of 600 C-1200 C. This high-temperature annealing step reduces or eliminates defects in the high-k dielectric layer 117. Specifically, high-k dielectric layer 117 may include positive trapped charges that would otherwise lead to an excessively high threshold voltage for any of the PFET devices. In this example such annealing step reduces the positive trapped charges to precisely tune PMOS gates.

As mentioned above, the present embodiment includes three main cycles. FIG. 8 begins an illustration of the third main cycle, which includes removing the dummy cap 119 and replacing the dummy cap 119 with NMOS and PMOS metal gates. FIGS. 8-13 show the PMOS gates being formed first, though in other embodiments, the NMOS gates may be formed first.

In FIG. 8, a Plasma Enhanced Oxide (PEOX) process creates PEOX layer 130. Then, photoresist layer 131 is patterned on PEOX layer 130 to open up the PMOS regions of device 100. Then, a photolithography process may be performed to remove portions of PEOX layer 130. PEOX layer 130 and photoresist layer 131 protect the NMOS regions while the dummy cap 119 is removed from the PMOS regions.

Figure 9:
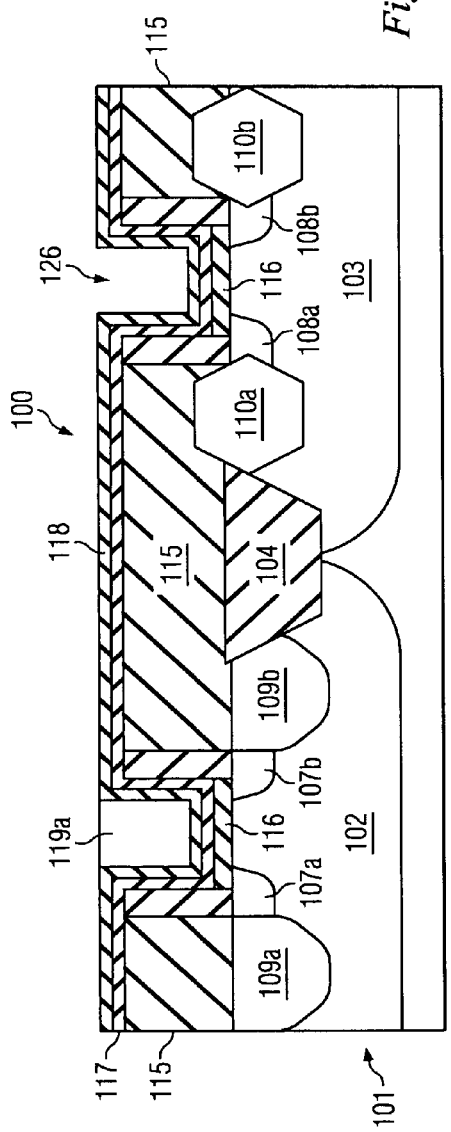

At FIG. 9, dummy cap 119 is removed from the PMOS areas. For instance, a dry or wet etch may be used to remove dummy cap 119 from the PMOS areas. Then, the PEOX layer 130 and the photoresist layer 131 are removed. Photoresist layer 131 may be removed using wet stripping, and the PEOX layer 130 may be removed using HF etching.

Figure 10:
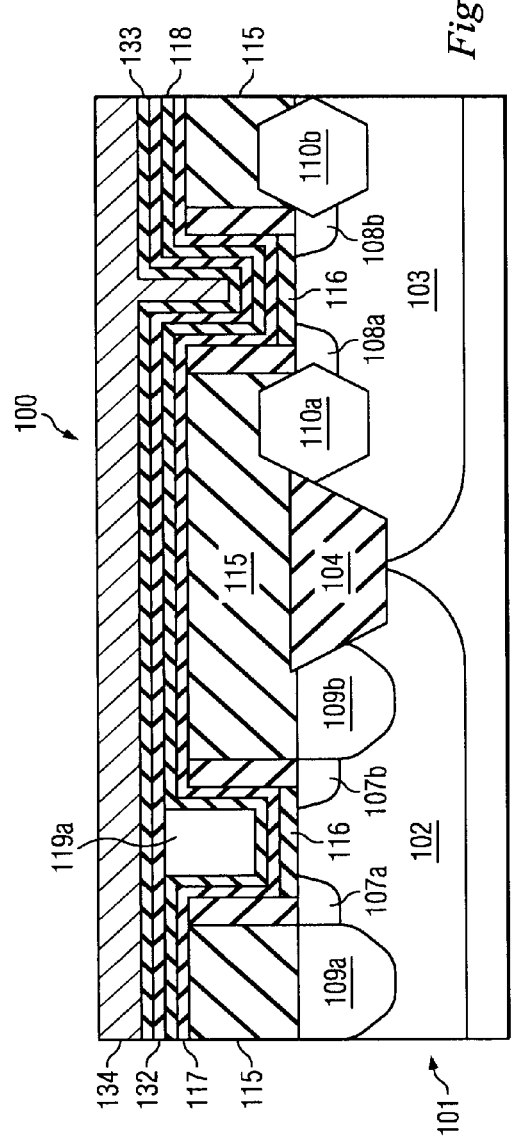

FIG. 10 shows formation of gates in the PMOS areas. A barrier metal layer 132 is formed using, e.g., ALD or PVD tantalum nitride, ALD or PVD titanium nitride, or other suitable material. PMOS work function metal layer 133 is formed thereon using, e.g., ALD or PVD tantalum nitride, ALD or PVD titanium nitride, or other suitable material. In some examples, a layer of TiAl or TiAlN is deposited after the PMOS work function metal layer Further, in some examples, PMOS work function metal layer 133 may also include tungsten nitride. Aluminum fill is then deposited by, e.g., PVD or CVD.

Figure 11:
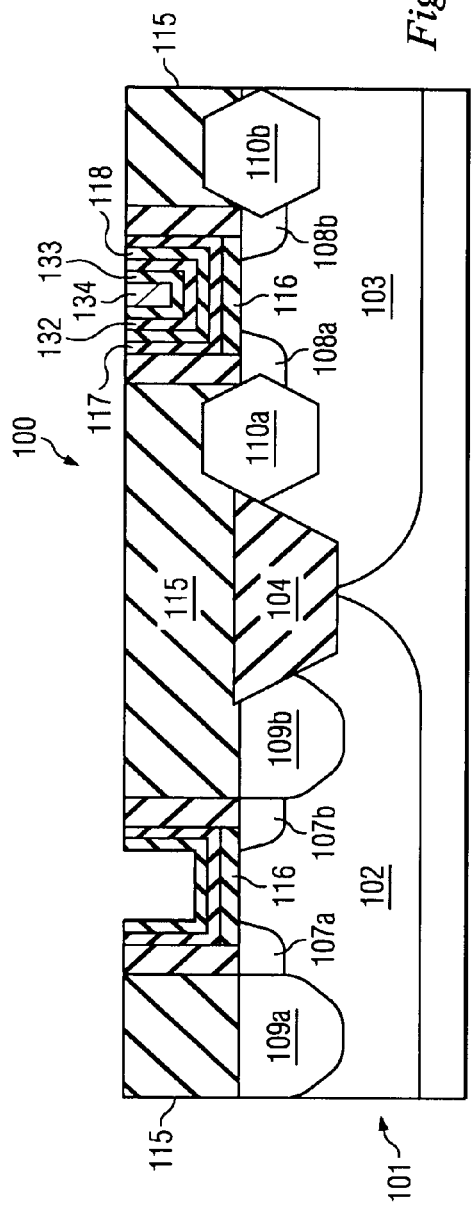

In FIG. 11, a CMP process may be used to remove portions of layers 132, 133, 134 down to ILD 115. Then, the dummy cap 119 may be removed from NMOS areas using any suitable processes, such as those described above with respect to FIG. 8.

Figure 12:
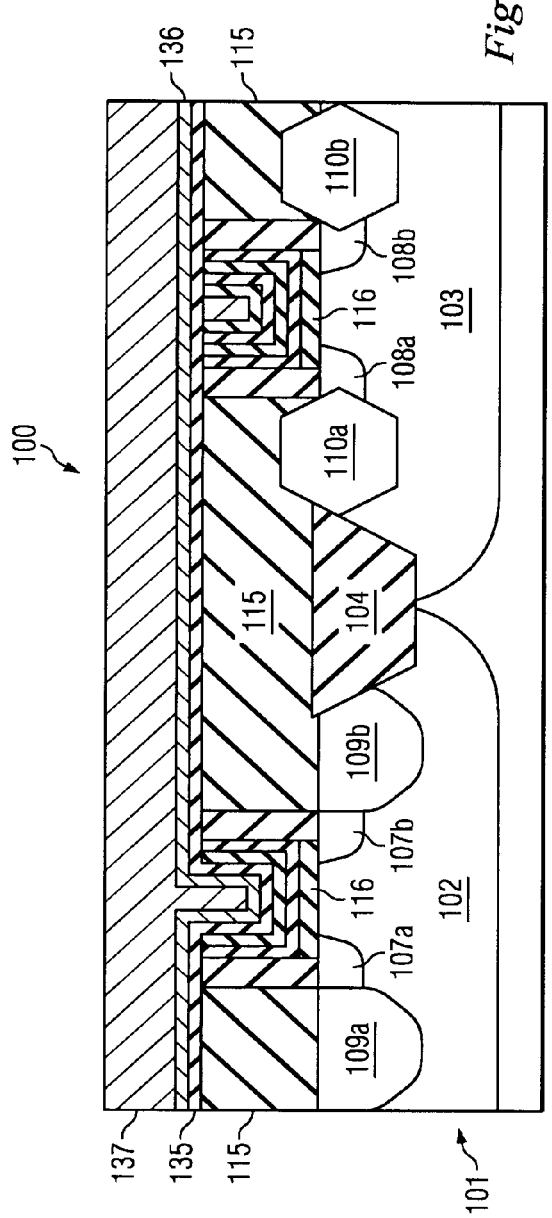

In FIG. 12, the layers that form the NMOS metal gates are formed. A barrier metal layer 135 is formed using, e.g., ALD or PVD tantalum nitride, ALD or PVD titanium nitride, or other suitable material. NMOS work function metal layer 136 is formed thereon using, e.g., ALD or PVD titanium aluminum, titanium aluminum nitride or other suitable material. In some embodiments, rather than having work function metal layer 136, a layer of ALD or PVD TiN and another layer of PVD TiN may be used to prevent aluminum penetration. In fact, the scope of embodiments is not limited to any particular set of materials or processes for making and shaping those materials.

Figure 13:
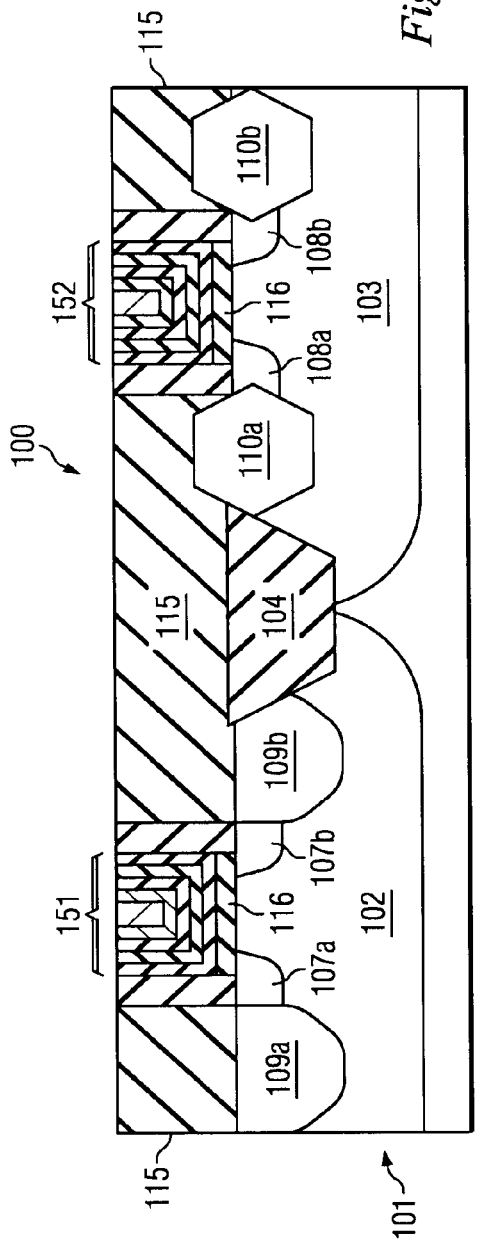

Al fill layer 137 may be formed by, e.g., CVD or PVD. FIG. 13 shows device 100 with gate structures 151, 152 after a CMP process to remove portions of Al fill layer 137. Gate structure 151 is associated with an NMOS device on the left half of FIG. 13, and gate structure 152 is associated with a PMOS device on the right half of FIG. 13.

As mentioned above, the cross-sections shown in FIGS. 1-13 show an end-on view of the trenches in which gates 151, 152 are formed. While not shown in FIG. 13, there is a PMOS device similar to the right-side PMOS device behind the NMOS device on the left half of FIG. 13. There is also an NMOS device similar to the left-side NMOS device behind the PMOS device on the right side of FIG. 13.

FIG. 14 is an illustration of two adjacent gate electrodes, such as may be formed in trench 125 or 126 (FIG. 5). FIG. 14 is a cross-section perpendicular to the cross-sections of FIGS. 1-13. Gate electrode 1402 is for a pull-down device (e.g., a NFET), and gate electrode 1404 is a gate for a pull-up device (e.g., an PFET). Together, gate electrodes 1402, 1404 may find use in an inverter.

Gate electrode 1402 includes Al fill 1410, aluminum block layer 1412, NMOS work function metal layer 1414, barrier layer 1416, and TiN cap layer 1418. Gate electrode 1402 is substantially similar to gate structure 151 of FIG. 13. Gate electrode 1404 includes Al fill 1420, aluminum block layer 1422, PMOS work function metal layer 1424, barrier layer 1426, and TiN cap layer 1418.

Gate electrode 1404 is similar to gate structure 152 of FIG. 13 N-metal 1414 and p-metal 1424 in gate electrodes 1402 and 1404 are physically and electrically separated from each other by barrier layers 1416 and 1426 to prevent aluminum penetration and work function metal intermixing Gate electrodes 1402 and 1404 share TiN layer 1418 and high-k dielectric material 1430. It is noted that layers 1418 and 1430 substantially surround the combined P/N gate electrode structure on three sides, leaving only the top exposed.

For gate electrode 1402, the p-metal includes a metal-based conductive material having a work function compatible a PFET device. For one example, the p-metal has a work function of about or greater than about 5.0~5.2 eV. As shown in FIG. 14, the p-metal may include various metal-based film as a stack for optimized device performance and processing compatibility.

For gate electrode 1404, the n-metal includes a metal-based conductive material having a work function compatible with an NFET device. For one example, the n-metal has a work function of about or less than about 4.0~4.2 eV. The n-metal may include various metal-based film as a stack for optimized device performance and processing compatibility.

FIGS. 1-14 illustrate a scenario wherein PMOS and NMOS devices share a high-k dielectric layer, and the high-k dielectric layer is annealed before metal gate structures are formed. Such feature may be advantageous because it may reduce thermal exposure of the metal gate structures. Furthermore, the work function metal in each of the gate electrodes 1402, 1404 is formed from separate metal layers and can be tuned more precisely. Separate formation of the work function metal in the DU process of FIGS. 1-14 enables the barrier metal (e.g., TaN) to be scaled more precisely in contrast to conventional techniques that create an NMOS gate using both PMOS and NMOS metal. More precise barrier metal scaling may provide for increased NFET gate corner turn on capability. Moreover, some embodiments may include TiN layers that block diffusion of Al, thereby reducing or eliminating work function metal intermixing and providing more accurate tuning of threshold voltage.

The embodiments of FIGS. 15-22 illustrate a scenario in which a high-k dielectric layer is formed separately for NFET and PFET devices. Such process may further reduce work function metal intermixing by separating adjacent metal gate structures with layers of high-k dielectric. Such embodiment is discussed in more detail below.

It should be noted that the present embodiment includes many materials and processing steps that are the same as or very similar to those described above with respect to FIGS. 1-14. Accordingly, where a material or process has been described in more detail above, such detail is not repeated below.

Figure 15:
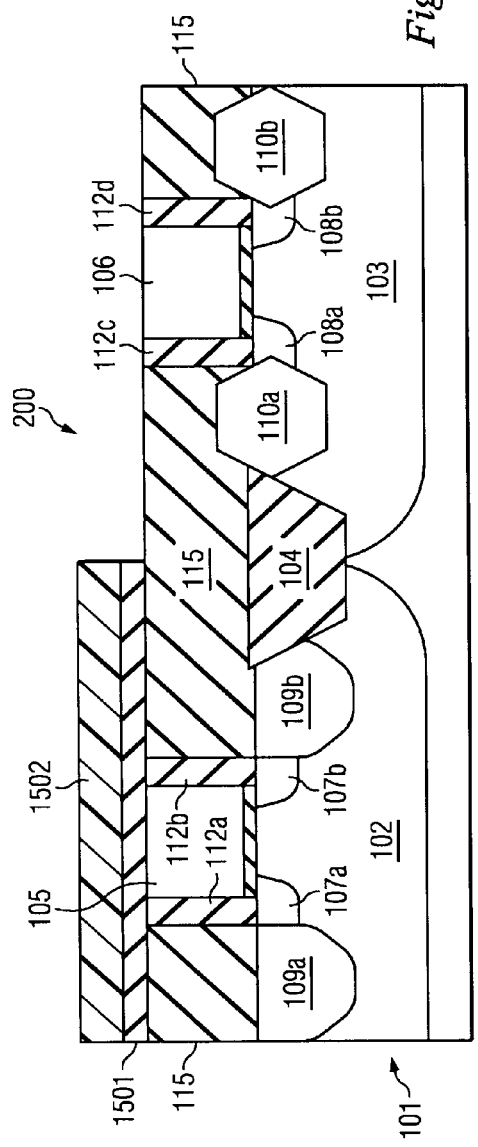

The present embodiment begins substantially similarly to the embodiment of FIGS. 1-14. As such, the discussion of the present embodiment assumes that the processes illustrated in FIGS. 1-4 have been completed. FIG. 15 picks up immediately thereafter.

Figure 16:
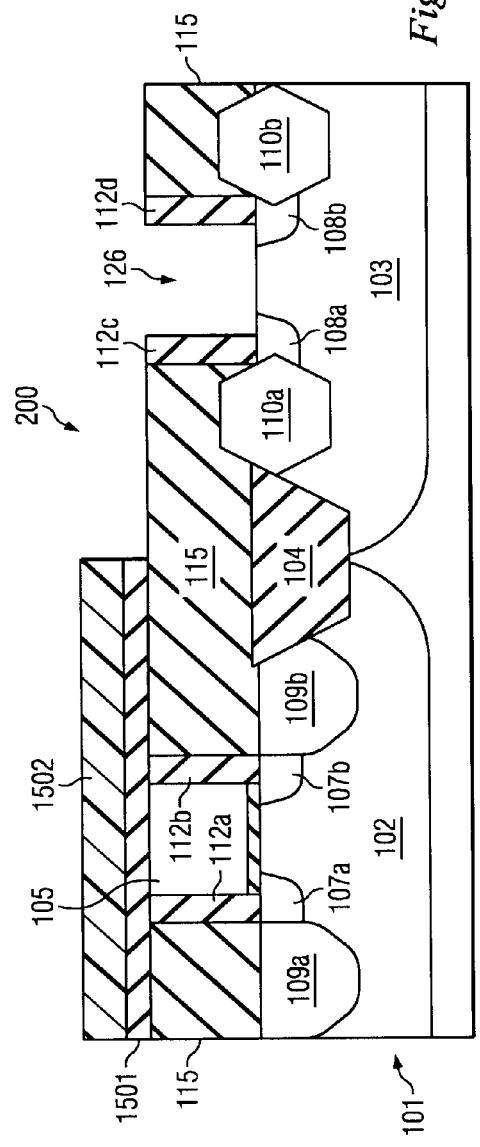

FIGS. 15-22 illustrate device 200 in various stages of manufacture. At FIG. 15, PEOX layer 1501 is formed across the ILD 115. Photoresist layer 1502 is formed and patterned so as to open up the PMOS side (right side). A photolithography process is then performed to pattern PEOX layer 1501 as shown. Dummy gate 106 is then removed, and in instances wherein an interfacial layer may underlie dummy gate 106, such interfacial layer may be removed as well. FIG. 16 shows dummy gate 106 having been removed to expose trench 126.

Figure 17:
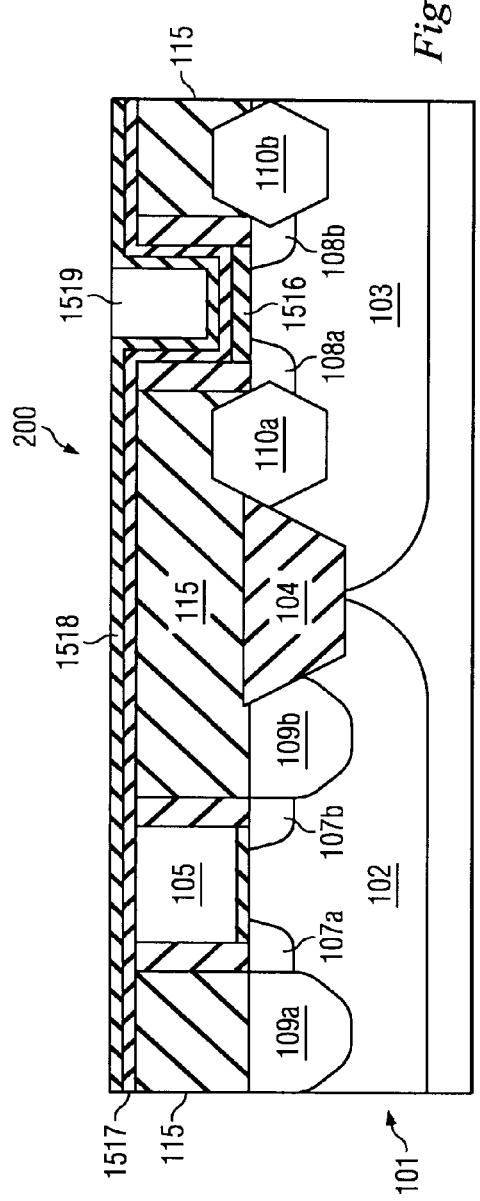

Photoresist layer 1502 and PEOX layer 1501 are then removed, as described above with respect to FIG. 8. In FIG. 17, interfacial layer 1516, high-k dielectric layer 1517, and TiN cap layer 1518 are formed, as described above with respect to FIG. 6. Dummy cap 1519 is also formed and planarized as described above with respect to FIGS. 6 and 7.

It should be noted that in the present embodiment, dummy gate 105 has not been removed, and layers 1517, 1518 and dummy cap 1519 have been formed for the PMOS devices only.

Following formation of layers 1517, 1518 and dummy cap 1519, device 200 is subjected to a high-temperature annealing, as discussed above with respect to FIG. 7. As explained above, high-k dielectric layer 1517 may have a positive trapped charge that might lead to a high threshold voltage for the PMOS devices. Accordingly, the high-temperature annealing step is performed to ameliorate this characteristic and to tune the gates for the PMOS devices. By contrast, in this example, the NMOS threshold voltages can be adequately tuned by implantation and manipulation of the work function metal in the NMOS gates.

Figure 18:
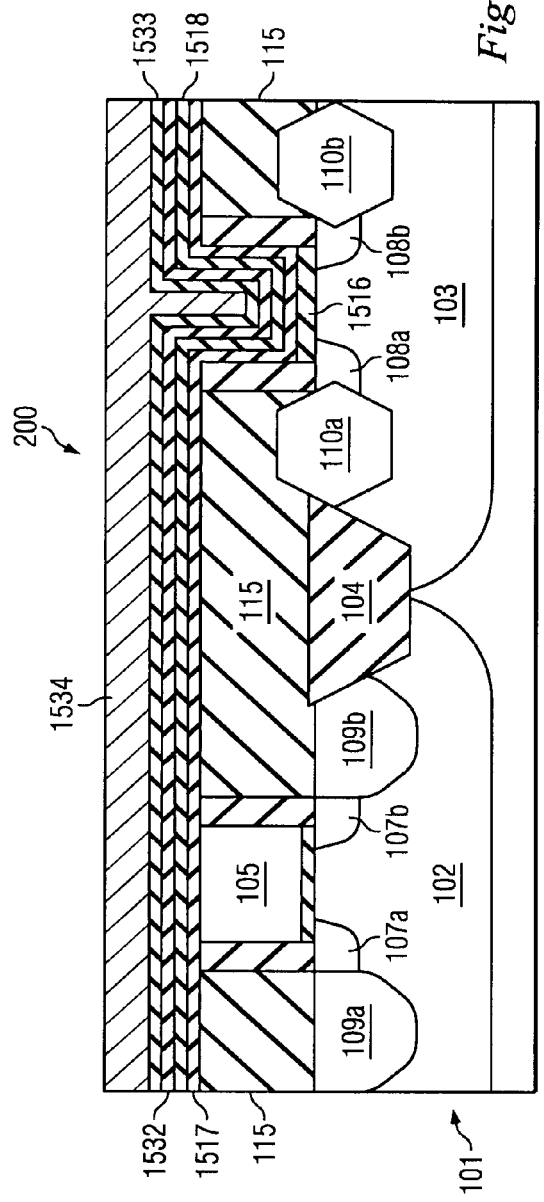

In FIG. 18, dummy cap 1519 is removed, as described above with respect to FIG. 9. Additionally, barrier layer 1532 and TiN cap layer 1533, and Al fill 1534 are formed, as explained above with respect to FIG. 10.

At FIG. 19, CMP is performed to remove portions of layers 1517, 1518, and 1532-1534, as explained above with respect to FIG. 11. Furthermore, dummy gate 105 is removed similarly to the removal of dummy gate 106 at FIG. 16. The removal of dummy gate 106 creates trench 125.

Figure 21:
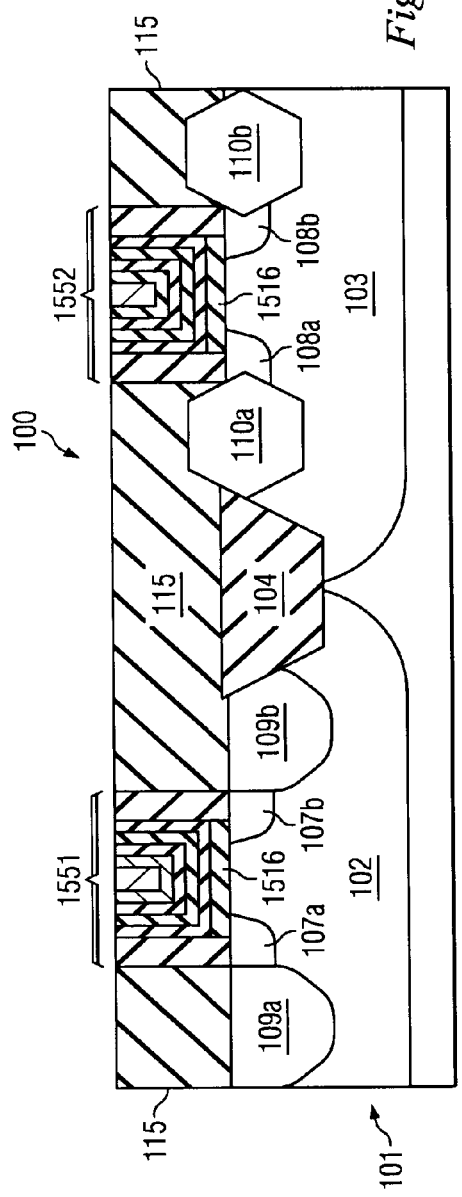

FIGS. 20 and 21 show the creation of NMOS metal gate structures. Interfacial layer 1537, high-k dielectric layer 1538, and TiN layer 1539 are formed and patterned, as discussed above with respect to FIG. 17. Barrier layer 1535, NMOS work function metal layer 1536, and Al fill 1537 are formed as discussed above with respect to FIG. 12. Barrier layer 1535, NMOS work function metal layer 1536, and Al fill 1537 are then planarized as discussed above with respect to FIG. 13 to form metal gate structures 1551, 1552. Various substitutions and additions for n-metal, such as discussed above with FIG. 13 are applicable to the embodiment shown in FIG. 21 as well.

The NMOS metal gates of this example (e.g., metal gate 1551) may be adequately tuned even when high-k dielectric layer 1538 is not subjected to high-temperature annealing. Thus, it may be advantageous in some embodiments to skip an annealing step for high-k dielectric layer 1538 so as not to damage the PMOS gate structures (e.g., gate structure 1552). Alternatively, some embodiments may include a low-temperature annealing step of 600 C or below, if desired.

NMOS metal gate structure 1551 can be electrically coupled with an adjacent PMOS metal gate structure (not shown) directly behind NMOS metal gate structure 1551. PMOS metal gate structure 1552 can be electrically coupled with an adjacent NMOS metal gate structure (not shown) directly behind PMOS metal gate structure 1552.

Figure 22:
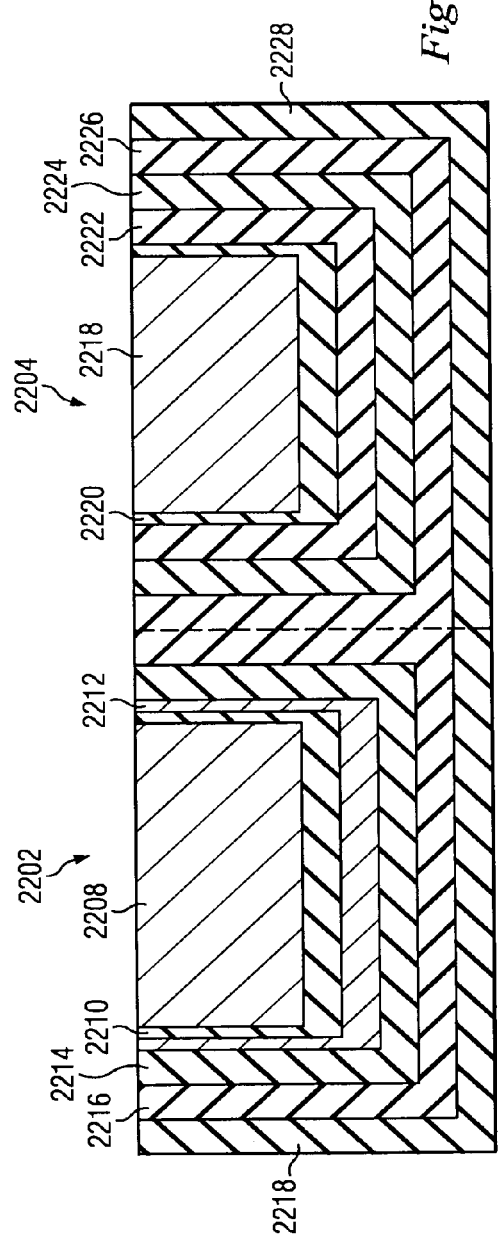
FIG. 22 is a cross-section perpendicular to the cross-section of FIGS. 15-21.

FIG. 22 is an illustration of two adjacent gate electrodes in a trench, such as might be formed on the right side of FIG. 21. FIG. 22 is a cross-section perpendicular to the cross-sections of FIGS. 15-21 and along a depth dimension of an ILD trench. Gate electrode 2202 is for a pull-down device (e.g., a NFET), and gate electrode 2204 is for a pull-up device (e.g., an PFET). Together, gate electrodes 2202, 2204 may find use in an inverter. In this example, gate electrodes 2202 and 2204 are physically and electrically separated from each other by high-k dielectric layers 2218, 2228. Thus some embodiments may further include a step that adds an upper-level metal layer (not shown) to electrically couple gates 2218, 2228.

Gate electrode 2202 includes Al fill 2208, aluminum block layer 2210, NMOS work function metal layer 2212, barrier layer 2214, TiN layer 226, and is surrounded by high-k dielectric layer 2218. Gate electrode 2202 is substantially similar to gate 1551 of FIG. 21. Gate electrode 2204 includes Al fill 2218, aluminum block layer 2220, PMOS work function metal layer 2222, barrier layer 2224, TiN layer 2226, and is surrounded by high-k dielectric layer 2228. High-k dielectric layers 2218, 2228 form a double-U shape, that is illustrated in FIG. 22.

Gate electrode 2204 is similar to gate structure 1552 of FIG. 21 Gates 2202 and 2204, as mentioned above, are separated by high-k dielectric layers 2218, 2228. Thus, gate electrodes 2202 and 2204 provide the same advantages articulated above with respect to the gates of FIG. 13, but with added protection against work function metal intermixing by virtue of the separation provided by high-k dielectric layers 2218, 2228 and cap layers 2216, 2226.

Figure 23:
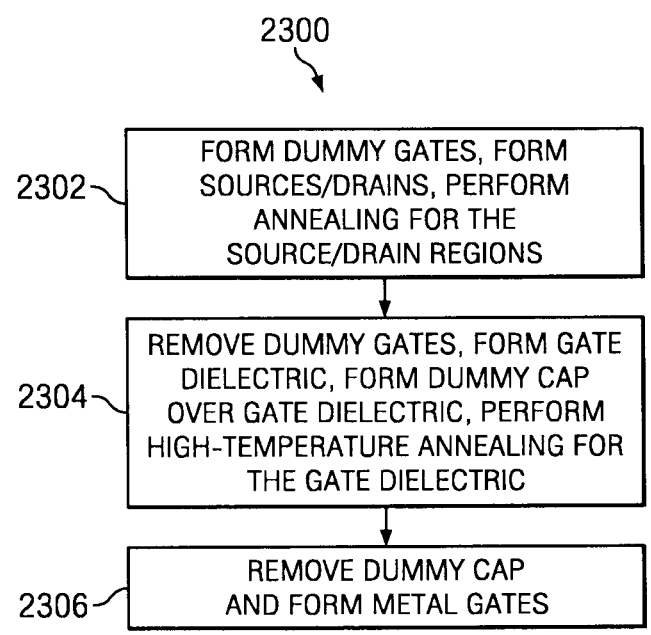
FIG. 23 is a process flow for an exemplar method of manufacturing a semiconductor device with metal gates.

FIG. 23 is an illustration of exemplary method 2300 adapted according to one embodiment for manufacturing a semiconductor device. Method 2300 may be performed by one or more machines at one or more fabrication facilities. The semiconductor devices produced by method 2300 may be formed on wafers that are subsequently separated to form dies. An exemplary die may include an SRAM integrated circuit. Method 2300 encompasses the methods described above with respect to FIGS. 1-14 and FIGS. 15-22.

In block 2302, dummy gates are formed. After the dummy gates are formed, areas of the substrate surrounding the dummy gates are implanted with ions to form sources and drains for P-type and N-type devices. Annealing is performed to finish the source and drain regions.

In block 2304, the dummy gates are removed. A gate dielectric, such as a high-k dielectric, is then formed in the trenches left by the removal of the dummy gates. Then a dummy cap is formed over the gate dielectric. Any high-temperature annealing for the gate dielectric is then performed before the metal gate structures are formed. In some embodiments, N-type devices and P-type devices share the same gate dielectric layer (as in FIGS. 1-14). In other embodiments, N-type devices and P-type devices have their own respective gate dielectric layers (as in FIGS. 15-22), and block 2304 may further include forming upper-level metal layers to electrically couple adjacent gates in the same trench.

In block 2306, the dummy cap is removed, and the metal gates are formed. Various embodiments may differ from the particular steps shown and described above. Some embodiments may add, omit, rearrange, or modify some actions. For instance, various embodiments include further processing steps to form other device on the substrate, to separate dies on the wafers, and to package the dies.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
   a dielectric layer on a substrate;
   a P-type transistor having a first gate stack embedded in the dielectric layer; and an N-type transistor having a second gate stack embedded in the dielectric layer;
wherein the first gate stack includes:
a first metal gate electrode;
a first gate dielectric layer underlying the first metal gate electrode and covering at least a sidewall of a trench; and
a first cap layer between the first gate dielectric layer and the first metal gate electrode; and
wherein the second gate stack includes:
a second metal gate electrode;
a second gate dielectric layer underlying the second metal gate electrode and covering at least a sidewall of the trench; and
a second cap layer between the second gate dielectric layer and the second metal gate electrode; and
further wherein the first and second gate stacks are adjacent, and the first and second metal gate electrodes are separated from each other by the first and second cap layers, and the first gate dielectric layer and the second gate dielectric layer form a continuous, substantially planar top surface extending underneath both the first metal gate electrode and the second metal gate electrode.

2. The semiconductor device of claim 1, further comprising:
an upper-level metal structure electrically coupling the first and second metal gate electrodes.

3. The semiconductor device of claim 1, in which the P-type transistor and the N-type transistor comprise an inverter.

4. The semiconductor device of claim 1, comprising a Static Random Access Memory (SRAM) circuit.

5. The semiconductor device of claim 1, in which the first cap layer comprises titanium nitride.

6. The semiconductor device of claim 1, in which the second cap layer comprises titanium nitride.

7. The semiconductor device of claim 1, further comprising a first and a second barrier metal layer between the first and second metal gate electrodes.

8. A Random Access Memory (RAM) integrated circuit comprising:
a P-type device and an N-type device formed on a substrate;
the P-type device comprising a first metal gate structure, and the N-type device comprising a second metal gate structure formed in a Inter Layer Dielectric (ILD) trench with the first metal gate structure;
wherein a dimension of the ILD trench includes the first and second metal gate structures separated by first and second cap layers, and in which a gate dielectric layer forms a continuous, substantially planar top surface extending underneath both the first and second metal gate structures and covers at least a sidewall of the ILD trench.

9. The RAM integrated circuit of claim 8, in which the first and second metal gate structures comprise aluminum as a fill metal and in which the first and second cap layers comprise titanium nitride.

10. The RAM integrated circuit of claim 8, further comprising an upper-level metal structure electrically coupling the first and second metal gate structures.

11. The RAM integrated circuit of claim 8, in which the P-type device and the N-type device are included in an inverter.

12. The RAM integrated circuit of claim 8, in which the dimension of the ILD trench further includes a first and a second barrier metal layer between the first and second metal gate structures.

13. A semiconductor device, comprising:
a substrate;
an Inter-Layer Dielectric (ILD) material on the substrate;
a first gate dielectric layer and a first cap layer formed within an ILD trench in the ILD material;
a second gate dielectric layer and a second cap layer formed within the ILD trench;
annealed doped source and drain regions in the substrate at sides of the ILD trench;
a first metal gate within the ILD trench; and
a second metal gate within the ILD trench adjacent the first metal gate;
in which a dimension of the ILD trench includes the first and second metal gates separated by a P-type Metal Oxide Semiconductor (PMOS) work function layer of the first metal gate and an N-type Metal Oxide Semiconductor (NMOS) work function layer of the second metal gate;
a first barrier metal layer around the PMOS work function layer;
a second barrier metal layer around the NMOS work function layer;
wherein the first gate dielectric layer and the second gate dielectric layer form a continuous substantially planar top surface that extends underneath the first metal gate, the first barrier metal layer, the second metal gate, and the second barrier metal layer,
wherein the first cap layer and the second cap layer extend between the first metal gate and the second metal gate, and
wherein the first gate dielectric layer, the second gate dielectric layer, the first cap layer and the second cap layer substantially extend along sidewalls of the ILD trench.

14. The semiconductor device of claim 13, in which the semiconductor device is part of a Random Access Memory (RAM) integrated circuit.

15. The semiconductor device of claim 13, in which the first metal gate is part of a p-type transistor and the second metal gate is part of an n-type transistor.

16. The semiconductor device of claim 13, in which the dimension of the ILD trench further includes the first barrier metal layer and the second barrier metal layer between the first and second metal gates.

17. The semiconductor device of claim 13, in which the first and second cap layers comprise titanium nitride.

18. The semiconductor device of claim 13, in which the first and second metal gates comprise aluminum as a fill metal.

19. The semiconductor device of claim 13, further comprising an upper-level metal structure electrically coupling the first and second metal gates.

20. The semiconductor device of claim 13, in which the first and second metal gates comprise an inverter.

* * * * *